United States Patent
Hopkins et al.

(10) Patent No.: US 12,308,240 B2
(45) Date of Patent: May 20, 2025

(54) METHOD AND APPARATUS

(71) Applicant: SPTS Technologies Limited, Newport (GB)

(72) Inventors: Janet Hopkins, Newport (GB); Simon Dawson, Newport (GB)

(73) Assignee: SPTS Technologies Limited, Newport (GB)

(*) Notice: Subject to any disclaimer, the term of this patent is extended or adjusted under 35 U.S.C. 154(b) by 662 days.

(21) Appl. No.: 17/548,148

(22) Filed: Dec. 10, 2021

(65) Prior Publication Data
US 2022/0199409 A1    Jun. 23, 2022

(30) Foreign Application Priority Data
Dec. 17, 2020 (GB) ..................................... 2020022

(51) Int. Cl.
H01L 21/3065 (2006.01)
H01J 37/32 (2006.01)
H01L 21/683 (2006.01)

(52) U.S. Cl.
CPC ........ H01L 21/3065 (2013.01); H01J 37/321 (2013.01); H01L 21/6831 (2013.01)

(58) Field of Classification Search
None
See application file for complete search history.

(56) References Cited

U.S. PATENT DOCUMENTS

| | | | |
|---|---|---|---|
| 5,200,360 A | 4/1993 | Bradbury et al. | |
| 5,501,893 A | 3/1996 | Laermer et al. | |
| 5,872,061 A * | 2/1999 | Lee | H01L 21/02063 |
| | | | 257/E21.252 |
| 2001/0042923 A1 | 11/2001 | Yanagida | |
| 2004/0115934 A1 | 6/2004 | Broz et al. | |
| 2011/0168544 A1 * | 7/2011 | Shiono | H01J 37/32082 |
| | | | 427/539 |
| 2012/0322267 A1 * | 12/2012 | Engelhardt | H01L 21/78 |
| | | | 257/E21.252 |

FOREIGN PATENT DOCUMENTS

| | | |
|---|---|---|
| EP | 3159925 A1 | 4/2017 |
| WO | 2019230668 A1 | 12/2019 |

OTHER PUBLICATIONS

EPO, Extended European Search Report for EP Application No. 21210864, Apr. 25, 2022.
IPO, Search Report for GB2020022.6, May 20, 2021.

* cited by examiner

*Primary Examiner* — Shamim Ahmed
(74) *Attorney, Agent, or Firm* — Hodgson Russ LLP

(57) ABSTRACT

A metallic feature on a substrate is subjected to a plasma dicing process and is cleaned. The workpiece has a carrier sheet attached to a frame member. The carrier sheet carries the substrate. The workpiece is provided on a workpiece support disposed within a chamber of an inductively coupled plasma apparatus. A sputter etch step is performed, including introducing a sputter gas or gas mixture into the chamber and sustaining an inductively coupled plasma of the sputter gas or gas mixture so as to sputter etch the substrate. A chemical etch step also is performed, including introducing $O_2$ gas and/or $O_3$ gas) into the chamber and sustaining an inductively coupled plasma of the $O_2$ and/or $O_3$ gas) so as to chemically etch the substrate. The sputter etch step and chemical etch step can be repeated.

18 Claims, 2 Drawing Sheets

METHOD AND APPARATUS

CROSS-REFERENCE TO RELATED APPLICATIONS

This application claims priority to UK Patent Application No. 2020022.6 filed Dec. 17, 2020, the disclosure of which is hereby incorporated by reference.

FIELD OF THE DISCLOSURE

This invention relates to a method of cleaning a metallic feature, such as a metallic bond pad and/or bump, on a substrate. More specifically, this invention relates to a method of removing a fluorine-containing contaminant from a surface of a metallic feature, such as a metallic bond pad and/or bump, on a substrate. This invention also relates to associated apparatus for cleaning a metallic feature on a substrate.

BACKGROUND OF THE DISCLOSURE

A semiconductor substrate, such as a silicon wafer, is typically diced to singulate die. Dicing techniques can include mechanical cutting, laser grooving or plasma etching. In plasma etching techniques, the semiconductor substrate is typically positioned on a carrier sheet, such as a tape carrier, and surrounded by a frame member. Together, the semiconductor substrate 11, carrier sheet 12 and frame member 13 form a workpiece 10, as shown in FIG. 1. Plasma dicing permits an efficient way to singulate die in parallel, which can increase throughput for smaller die sizes; reduce street width to better utilise the wafer surface area and improve yield; and reduce damage to the die edges or sides, which can improve die strength and quality. In plasma dicing applications, the "Bosch process" is commonly used to etch streets in and to singulate die on a semiconductor substrate. The Bosch process is described in U.S. Pat. No. 5,501,893A and typically comprises a cyclical method of etch steps and deposition steps to form anisotropic etch profiles. Typically, the etch and/or deposition steps use fluorine-containing compounds, which can form fluorine-containing residues or contaminants on the surface of the substrate after the plasma etch process. Fluorine-containing contaminants on the surface of exposed metallic features, such as bond pads or bumps, can lead to corrosion and long-term reliability issues. While the majority of the die surface is protected by a dielectric passivation layer, the bond pads or metal bumps need to be exposed to facilitate wire or flip chip bonding to external circuits. Furthermore, where the metallic features is made from aluminium, reaction with fluorine-based process gases can form $AlF_3$, which will subsequently react to form $AlFO_3$ in ambient air (or another oxidising atmosphere). $AlFO_3$ contaminants provide a more resistive bond pad surface, and leads to the formation of non-optimal wire bonds.

In order to remove any residues, such as fluorine-containing residues, a post-etch cleaning process is typically required. Known cleaning processes to remove fluorine-containing contaminants, such as $AlFO_3$, from the bond pad surface include sputtering the substrate with Ar or a mixture of $Ar/O_2$. However, known methods may not be suited to cleaning diced substrates that are disposed on a temperature-sensitive carrier sheet. It is desirable to develop an improved method for cleaning metallic features on a substrate, wherein the workpiece is maintained below strict temperature constraints.

It is desirable to develop an improved method for cleaning exposed metallic features on a substrate, in particular after a plasma dicing process, in order to remove fluorine-containing contaminants from metallic features. It is desirable to remove fluorine-containing contaminants, such as $AlFO_3$, more effectively and to maintain the workpiece within strict thermal budgets.

BRIEF SUMMARY OF THE DISCLOSURE

The present invention, in at least some of its embodiments, seeks to address at least some of the above described problems, desires and needs. In particular, embodiments of the present invention seek to provide an improved method for cleaning metallic features, such as bond pads and/or bumps. Embodiments of the present invention seek to remove fluorine-containing residues or contaminants from metallic features whilst maintaining a low thermal budget to the workpiece. Furthermore, embodiments of the present invention can improve throughput, whilst still achieving an effective cleaning treatment.

According to a first aspect of the present invention there is provided a method for cleaning a metallic feature on a substrate of the type that is part of a workpiece that has been subjected to a plasma dicing process, the workpiece further comprising a carrier sheet attached to a frame member, wherein the carrier sheet carries the substrate, the method comprising the steps of:

providing the workpiece on a workpiece support disposed within a chamber of an inductively coupled plasma apparatus;

performing a sputter etch step comprising the sub-steps of introducing a sputter gas or gas mixture into the chamber, and sustaining an inductively coupled plasma of the sputter gas or gas mixture so as to sputter etch the substrate;

performing a chemical etch step comprising the sub-steps of introducing $O_2$ gas and/or $O_3$ gas) into the chamber, and sustaining an inductively coupled plasma of the $O_2$ and/or $O_3$ gas) so as to chemically etch the substrate; and repeating the steps of performing the sputter etch step and performing the chemical etch step.

The present cleaning method can remove contaminants, such as fluorine-containing contaminants (e.g. $AlFO_3$), from the substrate surface, for example from the surface of metallic features on the substrate. Alternating between a physical sputter etch step and a chemical etch step has been found to reduce the fluorine-containing contaminants present on the surface of metallic features on the substrate. Without wishing to be bound by any theory or conjecture, it is believed that the oxygen-containing chemical etch step helps to remove carbonaceous material from the surface of the substrate (including the surface of the metallic features), which helps to better prepare the substrate surface for a subsequent physical sputter etch step. As a result, the physical sputter etch step can be more effective and more selective in removing contaminants, such as fluorine-containing contaminants, from the surface of the metallic features. Overall, the method of the present invention enables a reduction in surface contaminants, such as fluorine-containing contaminants, with a shorter sputter etch duration. This can reduce problems associated with high resistivities and corrosion of the metallic features. This enables higher quality devices with better reliability to be produced with an improved throughput.

Since the levels of contaminants can be reduced using a shorter treatment duration, the workpiece can be maintained at a lower temperature which helps to avoid damage to the temperature-sensitive carrier sheet. Furthermore, the chemical etch step imparts a lower thermal load to the substrate, which can further help to maintain the workpiece at a suitably low temperature to avoid damaging the temperature-sensitive carrier sheet.

The sputter etch step and the chemical etch step can be performed in any order. For example, the first chemical etch step can be performed before the first sputter etch step. Alternatively, the first sputter etch step can be performed before the first chemical etch step.

The sputter etch step can further comprise the sub-step of applying an electrical bias power, such as an RF bias power, to the workpiece support whilst the plasma is being sustained. The RF bias can have a frequency of 2-20 MHz, and is typically 13.56 MHz.

Applying an electrical bias power, such as an RF bias power, to the workpiece support can impart directionality to the species in the plasma (i.e. make the plasma anisotropic). The electrical bias power applied to the workpiece support can be used to control the extent of ion bombardment at the substrate surface, and hence can control the rate of physical sputtering during the sputter etch step.

The electrical bias power applied to the workpiece support during the sputter etch step can have a magnitude of $\geq 500$ W, optionally $\geq 600$ W, optionally $\geq 700$ W, or optionally about 800 W. The electrical bias power applied to the workpiece support during the sputter etch step can have a magnitude of $\leq 1000$ W, optionally $\leq 900$ W, optionally $\leq 850$ W, or optionally about 800 W.

The chemical etch step can further comprise the sub-step of applying an electrical bias power, such as an RF bias power, to the workpiece support whilst the plasma is being sustained. The RF bias can have a frequency of 2-20 MHz, and is typically 13.56 MHz.

The electrical bias power applied to the workpiece support during the chemical etch step is typically lower than the electrical bias power applied to the workpiece support during the sputter etch step.

The electrical bias power applied to the workpiece support during the chemical etch step can have a magnitude of $\leq 250$ W, optionally $\leq 200$ W, optionally $\leq 150$ W, optionally $\leq 100$ W, optionally $\leq 75$ W, or optionally about 50 W. The electrical bias power applied to the workpiece support during the chemical etch step can have a magnitude of $\geq 0$ W, optionally $\geq 10$ W, optionally, $\geq 20$ W, or optionally $\geq 30$ W, optionally $\geq 40$ W, or optionally about 50 W. Applying a low bias power to the workpiece support during the chemical etch step can help to minimise the extent of physical sputtering occurring, and favour a chemical etch. By applying a low or zero bias power to the workpiece support, the chemical etch step imparts a lower thermal load to the workpiece. Therefore, the chemical etch step can also act as a cooling step, which can further help to maintain the temperature of the workpiece within the acceptable thermal limits.

The sputter gas or gas mixture can be introduced into the chamber at a flow rate in the range of 50-500 sccm, optionally 100-400 sccm, optionally 200-300 sccm.

The sputter gas or gas mixture can comprise, consist of or consist essentially of an inert sputter gas. An inert sputter gas physically sputters the workpiece without chemically reacting with the workpiece. The sputter gas or gas mixture can comprise, consist of or consist essentially of a noble gas. The noble gas can be argon, krypton or xenon. Preferably, the sputter gas or gas mixture consists of or consists essentially of argon gas. The sputter gas can comprise a low amount, such as trace amounts, of an auxiliary gas. The auxiliary gas can be $O_2$ gas. The auxiliary gas can be present in an amount of less 10%, optionally less than 5%, or optionally less than 1% (as a percentage of the total flow rate of the sputter gas mixture). The sputter gas can comprise an inert sputter gas, such as argon, in an amount of $\geq 90\%$, optionally $\geq 95\%$, or optionally 99%, as a percentage of the total flow rate of the sputter gas or gas mixture.

The $O_2$ and/or $O_3$ gas) can be introduced into the chamber at a flow rate in the range of 50-500 sccm, optionally 100-400 sccm, or optionally 200-300 sccm. The flow rate of the $O_2$ and/or $O_3$ gas) can be substantially the same as the flow rate of the sputter gas or gas mixture.

The $O_2$ and/or $O_3$ gas) can consist of or consist essentially of $O_2$ gas. The $O_2$ and/or $O_3$ gas) can comprise a low amount, such as trace amounts, of a diluent gas. The diluent gas can be a noble gas, such as argon gas. The diluent gas can be present in an amount of less than 10%, optionally less than 5%, or optionally less than 1% (as a percentage of the total flow rate of the $O_2$ and/or $O_3$ gas) in sccm).

During the sputter etch step, the chamber pressure can be in the range of 10-80 mTorr, optionally 15-50 mTorr, or optionally about 20 mTorr. During the chemical etch step, the chamber pressure can be in the range of 10-80 mTorr, optionally 15-50 mTorr, or optionally about 20 mTorr.

The workpiece support can be an electrostatic chuck. Using an electrostatic chuck (ESC) can help to cool the workpiece during plasma etch steps. The method can further comprise a cooling step for reducing the temperature of the workpiece, optionally in the absence of a plasma. The chemical etch step can be a cooling step. The sputter etch step and the chemical etch step can each be repeated any number of times, for example, at least 3 times, optionally at least 4 times, optionally at least 5 times, and optionally 6 times. The sputter etch step and the chemical etch step can be repeated a pre-determined number of times or until the level of contaminants falls below a pre-determined level. The number of repetitions can be determined based on the initial contaminant (e.g. fluorine) level, and the duration and etch rates of the sputter etch and chemical etch steps.

The plasma sustained during the sputter etch step and the chemical etch step is an inductively coupled plasma. The inductively coupled plasma is sustained using a plasma generation device. The plasma generation device can comprise a coil. RF power is typically applied to the plasma generation device (e.g. the coil) to sustain the inductively coupled plasma. The RF bias can have a frequency in the range of 2-20 MHz, and is typically 13.56 MHz. The RF power applied to the coil during the sputter etch step can be in the range of 0-500 W, optionally, 100-400 W, optionally 200-300 W. The RF power applied to the coil during the chemical etch step can be in the range of 1000-2000 W, optionally 1250-1750 W, or optionally about 1500 W.

Using an inductively coupled plasma (ICP) can enable a high plasma density to be sustained within the chamber during the sputter etch and chemical etch steps. Furthermore, using an ICP plasma can enable the bombardment of species in the plasma with the substrate to be readily controlled by controlling the electrical bias power applied to the workpiece support. Therefore, using an ICP plasma can provide better control of the cleaning process compared to other types of plasma.

The metallic feature can made from a metal or metal alloy. The metal or metal alloy can be selected from: aluminium, an aluminium alloy, copper, nickel, tin, silver, or a SnAg alloy. Where the metallic feature is made from aluminium or an aluminium alloy, the present method can remove fluorine-containing contaminants, such as $AlFO_3$, from the surface of the metallic feature. The metallic feature can be a metallic bond pad or a metallic bump. For example, the metallic feature can be an aluminium bond pad, or a copper bump.

The carrier sheet can be made from a polymeric material. The polymeric material can be polyolefin (PO), polyvinyl chloride (PVC), or polyethylene terephthalate (PET). The carrier sheet can have a softening point of about 90° C. Preferably, the temperature of the carrier sheet is maintained at or below about 60° C. The present method provides a process in which the thermal transfer to the workpiece is reduced compared to known methods. Therefore the temperature of the carrier sheet can be maintained well below its softening point, which can help to avoid thermal damage to the carrier sheet.

The workpiece comprises the substrate, the carrier sheet and the frame member. The carrier sheet is attached to the frame member. The carrier sheet carries the substrate.

The substrate can be a semiconductor substrate. The substrate can be a silicon wafer. The substrate can be a compound semiconductor wafer, such as a GaAs wafer. The substrate can have a diameter of about 200 mm or 300 mm.

The workpiece is subjected to a plasma dicing process prior to the step of providing the workpiece on the workpiece support. The plasma dicing process can be a Bosch etch process. The plasma dicing process can comprise cyclically repeating an etch step and a deposition step. The plasma dicing process can use a fluorine-containing etchant (e.g. $SF_6$) and/or a fluorine-containing deposition species (e.g. $C_4F_8$). The method of the present invention has particular application when performed after a plasma dicing process, such as a Bosch etch process. Fluorine-containing process gases used in the plasma dicing process can form fluorine-containing contaminants on the surface of the substrate, for example on the surface of metallic features. For example, if the metallic feature is made from aluminium, the fluorine-containing process gases can react with the aluminium surface to form $AlF_3$, which can further react in air (or another oxidising atmosphere) to form $AlFO_3$. The presence of such fluorine-containing contaminants can undesirably lead to corrosion and higher surface resistivities. The method of the present invention is particularly suited to remove fluorine-containing contaminants from the surface of substrates (including from the surface of metallic features) after a plasma dicing process.

The plasma dicing process can be performed in a plasma dicing chamber. The method can comprise transferring the workpiece from the plasma dicing chamber to the cleaning chamber (i.e. the chamber in which the sputter etch step and chemical etch step are performed). The plasma dicing chamber and the cleaning chamber can be a part of the same cluster tool. Performing the plasma dicing and subsequent cleaning treatments in different processing chambers can improve substrate throughput. Alternatively, the plasma dicing process, the sputter etch step and the chemical etch step can be performed in the same chamber.

According to a second aspect of the invention there is an inductively coupled plasma apparatus for cleaning a metallic feature on a substrate of the type that is part of a workpiece using the method of the first aspect, the workpiece further comprising a carrier sheet attached to a frame member, wherein the carrier sheet carries the substrate, the apparatus comprising: a chamber; a workpiece support disposed within the chamber; at least one gas inlet for introducing a gas or gas mixture into the chamber; a plasma generation device for sustaining an inductively coupled plasma within the chamber; and a controller configured to control and alternate between a sputter etch step and a chemical etch step, wherein the sputter etch step comprises the sub-steps of introducing a sputter gas or gas mixture into the chamber, and sustaining an inductively coupled plasma of the sputter gas or gas mixture so as to sputter etch the substrate, and wherein the chemical etch step comprises the sub-steps of introducing $O_2$ gas and/or $O_3$ gas) into the chamber, and sustaining an inductively coupled plasma of the $O_2$ and/or $O_3$ gas) so as to chemically etch the substrate.

The plasma generation device can comprise a coil. An RF power supply typically provides RF power to the coil to sustain the inductively coupled plasma within the chamber.

The apparatus can further comprise an electrical power supply, such as an RF power supply, for supplying an electrical bias power to the workpiece support. The workpiece support can be configured to receive an electrical bias power, such as an RF bias power, from the electrical power supply. The controller can be further configured to control the electrical bias power supplied to the workpiece support.

Whilst the invention has been described above, it extends to any inventive combination of the features set out above, or in the following description, drawings or claims. For example, any features disclosed in relation to one aspect of the invention may be combined with any features disclosed in relation to any other aspect of the invention.

DESCRIPTION OF THE DRAWINGS

Embodiments of the invention will now be described, by way of example only, with reference to the accompanying drawings, in which.

DETAILED DESCRIPTION OF THE DISCLOSURE

Apparatus suitable for performing the methods of the present invention include an adapted SPTS Mosaic™ 200 or 300 mm system, which is commercially available from SPTS Technologies Limited, located in Newport, South Wales, UK. All exemplary embodiments and comparative examples described below were performed using this apparatus. The apparatus comprises a chamber and a plasma generating device, such as a coil, arranged to sustain a plasma within the chamber. Typically, the plasma is an inductively coupled plasma. A workpiece support, such as a platen, is disposed within the chamber for supporting a workpiece thereon. An electrical bias power, such as an RF bias power, can be applied to the workpiece support. The workpiece support can comprise an electrostatic chuck (ESC). The ESC can comprise associated gas and fluid cooling channels to cool the workpiece. The apparatus further comprises a controller which is configured to control and alternate between different processing conditions during the steps of the present method. For example, the controller can control the process gas flow rates and the electrical bias power applied to the workpiece support.

Figure 1:
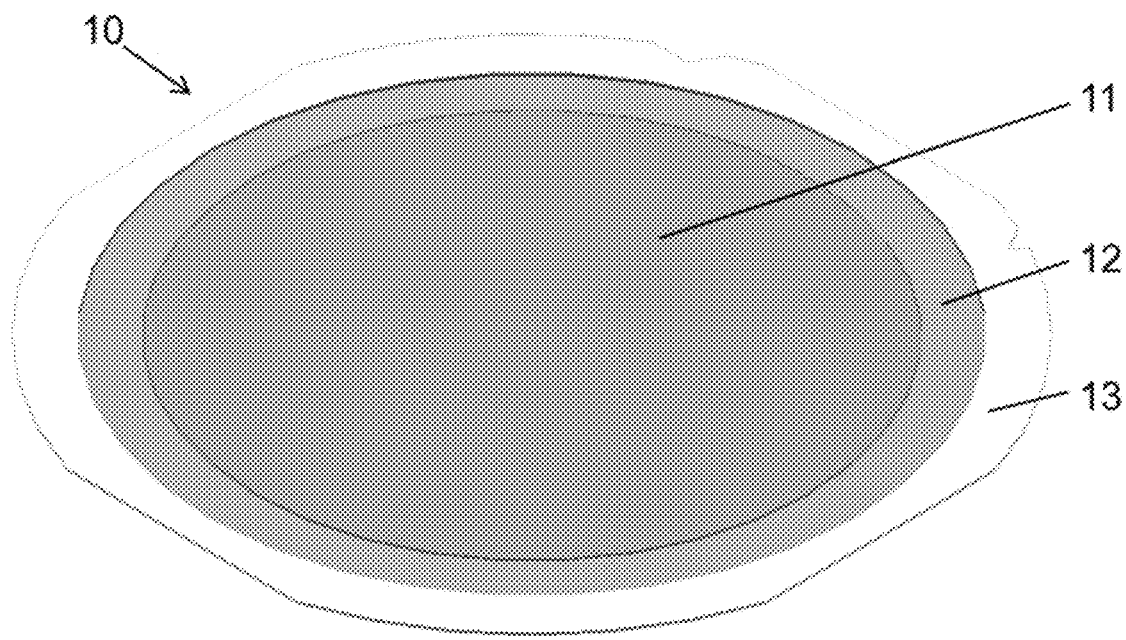
FIG. 1 is a perspective view of a workpiece.

FIG. 1 shows a workpiece 10 suitable for use in a plasma etching process. The workpiece 10 comprises a semiconductor substrate 11, such as a silicon wafer, positioned on a carrier sheet 12. The carrier sheet 12 is attached to and surrounded by a frame member 13. The frame member 13 can be made from a metallic or polymeric material.

The frame member 13 is sized to accommodate the semiconductor substrate. For example, when using a 300 mm diameter semiconductor substrate, the frame member may have a diameter of about 400 mm. Smaller or larger substrates can be used (e.g. a 200 mm diameter substrate).

The carrier sheet 12 (also referred to as a tape or tape carrier) can be made from a polymeric material, such as polyolefin (PO), polyvinyl chloride (PVC) or polyethylene terephthalate (PET). The carrier sheet typically has a softening point of approximately 90° C. In order to avoid damage to the carrier sheet 12 or to any adhesive, such as an acrylic adhesive, on the carrier sheet 12, it is highly desirable to maintain the temperature of the carrier sheet 12 at about 60° C. or less during a plasma etch process. The workpiece 10 can be cooled during a plasma etch process using techniques known in the art, for example, using an electrostatic chuck (ESC).

A plasma dicing or plasma etch process, such as a Bosch etch process, can typically use fluorine-containing etch and/or deposition species. For example, $SF_6$ can be used in an etch step, while a fluorine-containing polymerising gas, such as $C_4F_8$, can be used in a deposition step. The use of such fluorine-containing process gases exposes the substrate to fluorine chemistry. Metallic features on the substrate 11, such as bond pads and bumps, are particularly susceptible to reacting with fluorine or the fluorine-based process gases to form fluorine-containing residues. The metallic features, such as bond pads and/or bumps can be made from Al, an alloy of Al, another metal, such as copper or nickel; or SnAg.

Figure 2:
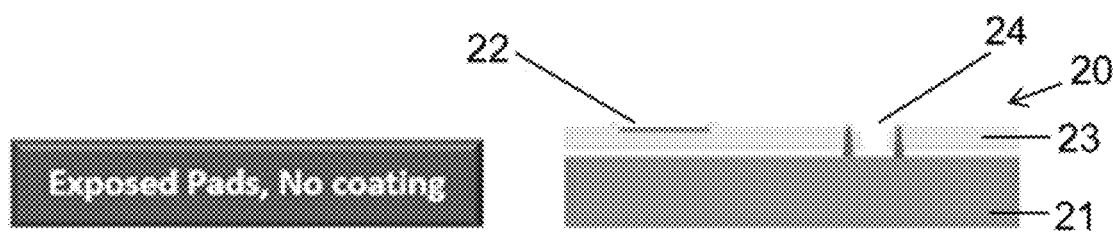
FIG. 2 is a cross-sectional view of a substrate.

FIG. 2 shows a schematic cross-section of a substrate 20 comprising a silicon wafer 21, an exposed metallic bond pad 22, interconnect layers 23, and an open scribe line 24. The bond pad 22 can be made of Al, an alloy of Al, Cu, Ni or another metal or metal alloy. The fluorine-based process gases used in an etch process can react with the bond pad 22 to form a fluorine-containing residue or contaminant. In turn, this can lead to corrosion of the bond pad 22, which can lead to reliability issues. For example, if the bond pad is made of aluminium, the fluorine-containing process gases can react with the bond pad to form $AlF_3$, which will further react in air (or an oxidising atmosphere) to form $AlFO_3$. The presence of $AlFO_3$ undesirably results in a more resistive bond pad surface and non-optimal wire bonds.

Figure 3:
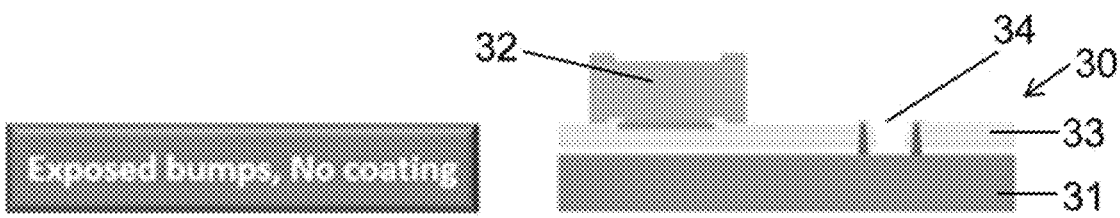
FIG. 3 is a cross-sectional view of a substrate.

FIG. 3 shows a cross-section of a substrate 30 comprising a silicon wafer 31, an exposed metal bump 32, interconnect layers 33, and an open scribe line 34. The metal bump 32 can be made from SnAg, Cu or Ni, for example. The fluorine-based process gases can react with the metal bump 32 to form hydrophobic surfaces. In turn, this can lead to packaging problems, such as poor wetting of surfaces and underfill or contact problems.

Figure 4:
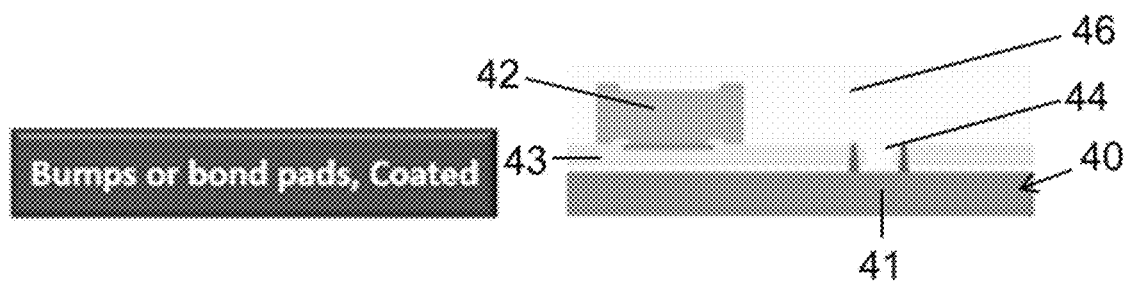
FIG. 4 is a cross-sectional view of a substrate.

To help reduce fluorine-containing contaminants, the metal features (e.g. bond pads or bumps) can be covered with a coating prior to the plasma dicing process. FIG. 4 shows a cross-section of a substrate 40 in which a bump 42 and a scribe line 44 are covered with a coating 46. A laser grooving process can be used to remove the coating 46 (and interconnect layers 43) above the scribe line 44 and to penetrate the surface of the substrate (e.g. to expose an underlying a silicon wafer or GaAs substrate 41). Subsequently, a plasma dicing process is performed to singulate the die. After the plasma dicing process, the coating 46 can be removed. Using a coating 46 can help to reduce the prevalence of fluorine-containing residues, however, the contamination problem can still persist albeit to a lesser extent.

Where fluorine-containing contaminants are present after a plasma dicing process, it is necessary to perform a post-plasma dicing cleaning step (or a de-fluorination step) to remove the fluorine-containing contaminants from the surface of the substrate. The post-plasma dicing cleaning step can be performed in the same chamber as the plasma dicing step or, alternatively, can be performed in a separate chamber dedicated for this task, for example a de-fluorination module, which could be part of the same cluster tool or part of a different system. It is preferable to perform the post-plasma dicing cleaning step in a separate chamber for productivity reasons. It is preferable for the separate de-fluorination chamber to be part of the same cluster tool as the plasma dicing chamber.

Figure 5:
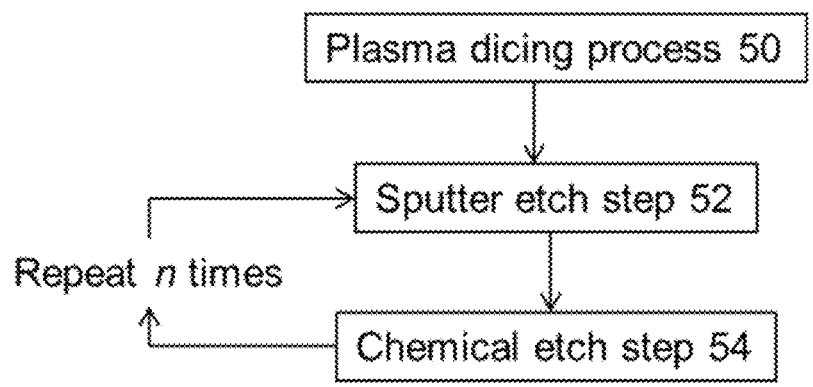
FIG. 5 is a schematic representation of an embodiment of the invention.
Figure 6:
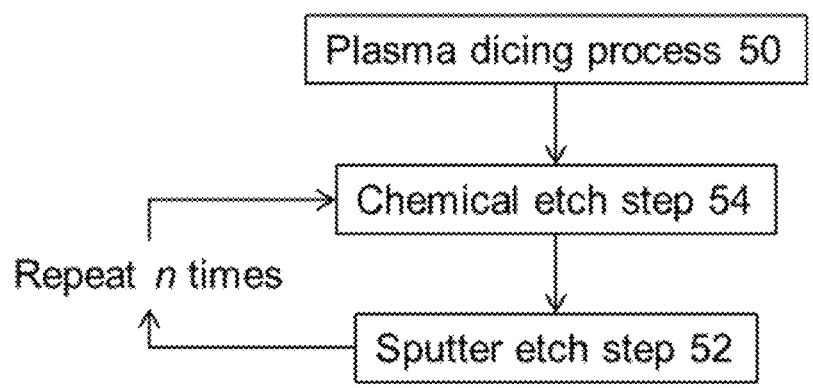
FIG. 6 is a schematic representation of an embodiment of the invention.

FIGS. 5 and 6 show representations of embodiments of the method of the present invention. The cleaning method of the present invention is typically performed after a plasma dicing process 50, such as a Bosch etch process. The cleaning method comprises steps to remove fluorine-containing contaminants from metallic features on a semiconductor substrate 11 that is part of a workpiece 10 of the type that also comprises a carrier sheet 12 and a frame member 13. The cleaning method comprises a sputter etch step 52 and a chemical etch step 54, which are alternately repeated a pre-determined number of times (i.e. n times, where n is a pre-determined number or a variable which is determined during use, for example by monitoring for a desired condition to be achieved). FIG. 5 shows an embodiment in which the sputter etch step 52 is performed before the chemical etch step 54. However, the sputter etch step 52 and the chemical etch step 54 can be performed in any order. FIG. 6 shows an alternative embodiment in which the chemical etch 54 is performed before the sputter etch step 52.

In some embodiments, the sputter etch step 52 is an inert gas sputter etch step, and the chemical plasma etch step 54 is an oxygen-containing plasma etch step.

The inert gas sputter etch step 52 comprises introducing an inert gas into a chamber and sustaining a plasma, such as an inductively coupled plasma, so that material is physically sputtered from the surface of the substrate. The physical sputtering can remove contaminants from the substrate surface. The inert gas is typically a noble gas (i.e. a gas from Group 18 of the periodic table of elements). Preferably, the inert gas consists of or consists essentially of argon. However, gaseous mixtures can also be employed. For example, a gaseous mixture used during the sputter etch step can comprise the inert gas (e.g. argon) and oxygen gas (i.e. $O_2$), wherein the gas flow rate of the inert gas ≥90%, of the total flow rate. An electrical bias, preferably an RF electrical bias, is applied to the workpiece support during the inert gas etch step. The electrical bias power is typically in the range of 500-1000 W, with an exemplary value of 800 W. Applying an electrical bias to the workpiece support helps to impart directionality onto the species in the plasma (i.e. to form an anisotropic plasma).

The chemical plasma etch step comprises introducing an oxygen-containing gas into the chamber and sustaining a plasma, such as an inductively coupled plasma, so that the substrate is exposed to an oxygen-containing plasma. The oxygen-containing gas can be $O_2$, $O_3$ or mixtures thereof. Preferably, the oxygen-containing gas consists of or consists essentially of $O_2$. However, small amounts of a diluent gas, such as argon gas, may be also added to the oxygen-containing gas. The present inventors found that alternating between a sputter etch step (e.g. using argon) and exposing the substrate to an oxygen-containing plasma (e.g. an $O_2$ plasma) beneficially increases the rate at which fluorine-containing contaminants are removed from the surface of metallic features, and also reduces the thermal load on the workpiece. Without wishing to be bound by any theory or conjecture, it is believed that the fluorine-containing contaminants are primarily uniformly removed as a result of physical sputtering (i.e. during the sputter etch step). However, exposing the substrate to the oxygen-containing plasma during the chemical plasma etch step helps to chemically remove carbonaceous residues from the surface of the substrate. Again without wishing to be bound by any theory or conjecture, it is believe that the carbonaceous residues can be residual organic matter remaining from the plasma dicing process due to the interaction of the plasma on the carrier sheet; or can arise due to interactions between the plasma and the carrier sheet during the sputter etch step. Removing these carbonaceous residues provides a better prepared surface that is more easily sputtered in a subsequent sputter etch step (e.g. using argon). This results in a more efficient sputter etch step with reduced sputter etch time. Furthermore, the amount of material that needs to be removed can be reduced whilst still achieving excellent removal of the fluorine-containing contaminants.

An electrical bias, preferably an RF electrical bias, can be applied to the workpiece support during the chemical plasma etch step 54. The electrical bias power used during the chemical plasma etch step 54 is typically lower than the electrical bias power used during the sputter etch step 52. Typically, the electrical bias power used during the chemical etch step 54 is between 2.5 and 250 times lower, optionally 5-50 times lower, optionally 10-20 times lower, and optionally about 16 times lower than the electrical bias power used during the sputter etch step 52. In some embodiments, no electrical bias power is applied during the chemical plasma etch step 54. For example, the electrical bias power is in the range of 0-200 W, with an exemplary value of 50 W. The electrical bias power during the chemical plasma etch step 54 is preferably below about 200 W so that the oxygen-containing plasma (e.g. $O_2$ plasma) acts to chemically react with the substrate. In this way, carbonaceous residues can be removed from the workpiece while avoiding additional thermal load on the workpiece. This can help to maintain the workpiece 10 at a low enough temperature to avoid damaging the carrier sheet 12 and/or the adhesive on the carrier sheet.

Additional cooling steps can be performed between the sputter etch step 52 and chemical etch step 54. Cooling can be performed through the use of an electrostatic chuck (ESC) as the workpiece support. Additional cooling steps can further help to maintain the temperature of the workpiece, in particular the carrier sheet, to within operable ranges above which damage to the carrier sheet may occur. For example, the temperature of the workpiece can be maintained at or below about 60° C. during the cleaning treatment.

Typical process parameters for the present invention are shown in Table 1.

TABLE 1

|  | Sputter etch step | Chemical etch step |
| --- | --- | --- |
| Coil (ICP) power (W) | 0-500 | 1000-2000 |
| Platen bias power (W) | 500-1000 | 0-200 |
| Pressure (mTorr) | 10-80 | 10-80 |
| Gas flow (sccm) | 50-400 | 50-400 |

In a first example (Example 1), a workpiece 10 comprising a semiconductor substrate 11 comprising aluminium bond pads and exposed scribe lines (as shown in FIG. 2) was subjected to a plasma dicing process using a Bosch etch. The workpiece 10 was subsequently transferred to a separate inductively coupled plasma chamber for a post-plasma dicing cleaning treatment to remove fluorine-containing contaminants (e.g. $AlFO_3$) according to a method of the present invention. The first plasma etch step was an argon sputter etch step 52. The second plasma etch step was an $O_2$ plasma etch step 54. The argon sputter etch step and the $O_2$ plasma etch step were each alternately repeated six times using the process parameters shown in Table 2. Each of the etch steps was performed in inductively coupled plasma (ICP) mode (i.e. with the ICP coil being driven) with a RF bias power being applied to the workpiece support. Each argon sputter etch step and each $O_2$ plasma etch had a duration of 20 s. The total processing time was 240 s, and did not require any additional cooling steps.

As a first comparative example (Comparative example 1), a workpiece was subjected to a plasma dicing process and transferred to a separate chamber for a post-plasma dicing cleaning treatment in the same way as the first example. However, the post-plasma dicing cleaning treatment solely consisted of an argon-only sputter etch step using the parameters shown in Table 2. The argon sputter etch step was performed in reactive ion etch (RIE) mode (i.e. without the ICP coil being driven). The duration of the argon sputter etch step was 180 s.

As a second comparative example (Comparative example 2), a workpiece was subjected to a plasma dicing process and transferred to a separate chamber for a post-plasma dicing cleaning treatment in the same way as the first example. However, the post-plasma dicing cleaning treatment comprised a sputter etch step wherein the feed gas was a mixture of argon and $O_2$ in a ratio of 90:10 based on their respective flow rates in sccm (hereinafter referred to as "Ar+$O_2$ (90:10)"). The processing parameters are shown in Table 2. The Ar+$O_2$ (90:10) etch step was performed in ICP mode (i.e. with the ICP coil being driven) with a RF bias being applied to the workpiece support. The duration of the Ar+$O_2$ (90:10) sputter etch was 240 s.

TABLE 2

| Parameter | Example 1 | | Comparative example 1 | Comparative example 2 |
| --- | --- | --- | --- | --- |
|  | Ar etch | $O_2$ etch | Ar only | Ar + $O_2$ (90:10) |
| Coil power (W) | 250 | 1500 | 0 | 250 |
| Platen power (W) | 800 | 50 | 800 | 800 |
| Pressure (mTorr) | 20 | 20 | 20 | 20 |
| Gas flow (sccm) | 300 | 200 | 150 | Ar: 270 sccm $O_2$: 30 sccm |

The fluorine contamination levels on the bond pad surfaces were determined using energy dispersive X-ray (EDX) measurements based on the F:O signal ratios using a 1.5 kV beam voltage. A workpiece that had not been subjected to a plasma dicing treatment was used as a first comparative reference. A workpiece that had been subjected to a plasma dicing process, but had not been subjected to any post-plasma dicing cleaning treatment was used as a second comparative reference.

The $SiO_2$ and SiN etch rates were also measured to record the selectivity of the etch process during the cleaning treatment.

Table 3 shows the results of the Example 1, Comparative example 1, and Comparative example 2.

TABLE 3

| Process | F:O measured by EDX | Oxide etch rate/μm/min | Nitride etch rate/μm/min |
|---|---|---|---|
| Reference pre-plasma dicing | 0.11 | — | — |
| Reference post plasma dicing | 1.26 | — | — |
| Example 1 [Looped Ar and $O_2$ etch] | 0.12 | $3.5 \times 10^{-3}$ | $2.3 \times 10^{-3}$ |
| Comparative example 1 [Ar sputter etch only] | 0.15 | $7.0 \times 10^{-3}$ | $4.8 \times 10^{-3}$ |
| Comparative example 2 [Ar + $O_2$ (90:10) etch only] | 0.15 | $5.3 \times 10^{-3}$ | $4.0 \times 10^{-3}$ |

Without wishing to be bound by any theory or conjecture, it is believed that the fluorine-containing contaminants, such as $AlFO_3$, formed on the aluminium bond pads are primarily removed by physical sputtering, for example, during an argon sputter etch step. Therefore, it would be expected that the fluorine-containing contaminants would be removed more effectively at a higher etch rate, and that the resultant F:O ratio would follow the etch rate trend for $SiO_2$ and SiN. That is, a higher $SiO_2$ and SiN etch rate would be expected to result in a lower F:O ratio. However, surprisingly, this is not observed.

Comparative example 1 (i.e. an Ar only sputter etch in RIE mode) had the highest etch rate, and therefore was the most aggressive etch treatment. However, despite the high etch rate, comparative example 1 only reduced the F:O ratio to a value of 0.15 (as determined by EDX).

Comparative example 2 (i.e. an sputter etch using a mixture of Ar+$O_2$ (90:10)) had a lower etch rate than comparative example 1. However, the resultant F:O ratio of 0.15 was the same as comparative example 1 (as determined by EDX).

Example 1 has the lowest etch rate for both $SiO_2$ and SiN, and therefore was the least aggressive etch. As a result, less material was etched during the cleaning treatment. However, despite this low etch rate, the method unexpectedly provided the greatest reduction in F:O ratio (to a value of 0.12 as determined by EDX). It is evident that the method of Example 1 provided the greatest reduction in fluorine-containing contaminants from the metallic features of the substrate, whilst etching a minimal amount of material. As such, the method provides an improved process for removing fluorine-containing contaminants from metallic features on a substrate.

A relatively low platen power (e.g. <200 W) was used during the $O_2$ plasma etch step of Example 1. Without wishing to be bound by any theory or conjecture, itis believed that using a relatively low platen power during the $O_2$ plasma etch step ensures that the $O_2$ plasma etch step proceeds mainly as a chemical etch. It is further believed that the low bias $O_2$ plasma etch step removes carbonaceous residues from the workpiece surface. By using a chemical etch step (rather than a sputter etch step), the thermal load on the workpiece is reduced. The low platen power used during the $O_2$ plasma etch step helps to reduce the thermal transfer of heat to the workpiece. Therefore, a significant reduction in fluorine-containing contaminants can be achieved while keeping the temperature of the workpiece within thermal budget constraints (e.g. about 60° C. or less) to avoid damage to the carrier sheet.

The chemical etch step 54 can act as a cooling step during the cleaning treatment, which avoids the need for any additional cooling steps (although these can be performed if desired). Therefore, the total processing time of the cleaning treatment can be reduced compared to known methods. Overall, this can increase substrate throughput.

Table 4 shows the total duration of the Ar sputter etch steps for Example 1, Comparative example 1 and Comparative example 2.

TABLE 4

| Process | Ar sputter etch duration (s) |
|---|---|
| Example 1 [Looped Ar and $O_2$ etch] | 120 |
| Comparative Example 1 [Ar sputter etch only] | 180 |
| Comparative Example 2 [Ar + $O_2$ (90:10) etch only] | 240 |

Without wishing to be bound by any theory or conjecture, it is believed that the sputter etch step is primarily responsible for increasing the thermal load on the workpiece 10 during the cleaning treatment. It is therefore desirable to keep the duration of the sputter etch step short in order to maintain the workpiece within suitable thermal budget constraints. It is evident that the method of the present invention provides a shorter sputter etch duration, which further helps to reduce the thermal load transferred to the workpiece, whilst also improving the removal of fluorine-containing contaminants.

Although the present disclosure has been described with respect to one or more particular embodiments, it will be understood that other embodiments of the present disclosure may be made without departing from the scope of the present disclosure. Hence, the present disclosure is deemed limited only by the appended claims and the reasonable interpretation thereof.

The invention claimed is:

1. A method for cleaning a metallic feature on a substrate of the type that is part of a workpiece that has been subjected to a plasma dicing process, the workpiece further comprising a carrier sheet attached to a frame member, wherein the carrier sheet carries the substrate, the method comprising the steps of:
   providing the workpiece on a workpiece support disposed within a chamber of an inductively coupled plasma apparatus;
   performing a sputter etch step comprising introducing a sputter gas or gas mixture into the chamber, and sustaining an inductively coupled plasma of the sputter gas or gas mixture so as to sputter etch the substrate;
   performing a chemical etch step comprising introducing $O_2$ gas and/or $O_3$ gas into the chamber, and sustaining an inductively coupled plasma of the $O_2$ and/or $O_3$ gas so as to chemically etch the substrate;
   removing a fluorine-containing residue or contaminant from the workpiece through the steps of performing the sputter etch step and performing the chemical etch step; and
   repeating the steps of performing the sputter etch step and performing the chemical etch step.

2. The method according to claim 1, in which the sputter etch step further comprises applying an electrical bias power to the workpiece support whilst the plasma is being sustained.

3. The method according to claim 2, in which the electrical bias power applied to the workpiece support during the sputter etch step has a magnitude of ≥500 W.

4. The method according to claim 3, in which the electrical bias power applied to the workpiece support during the sputter etch step has a magnitude of ≤1000 W.

5. The method according to claim 1, in which the chemical etch step further comprises applying an electrical bias power to the workpiece support whilst the plasma is being sustained.

6. The method according to claim 5, in which the electrical bias power applied to the workpiece support during the chemical etch step has a magnitude of ≤250 W, optionally ≤200 W.

7. The method according to claim 6, in which the electrical bias power applied to the workpiece support during the chemical etch step has a magnitude of ≥0 W.

8. The method according to claim 1, in which the sputter gas or gas mixture is introduced into the chamber at a flow rate in the range of 50-500 sccm.

9. The method according to claim 1, in which the sputter gas or gas mixture comprises an inert sputter gas.

10. The method according to claim 1, in which the sputter gas or gas mixture consists of or consists essentially of argon gas.

11. The method according to claim 1, in which the $O_2$ and/or $O_3$ gas is introduced into the chamber at a flow rate in the range of 50-500 sccm.

12. The method according to claim 1, in which the $O_2$ and/or $O_3$ gas consists of or consists essentially of $O_2$ gas.

13. The method according to claim 1, in which the workpiece support is an electrostatic chuck.

14. The method according to claim 1, in which the sputter etch step and the chemical etch step are each repeated at least 3 times.

15. The method according to claim 1, in which the metallic feature is made from a metal or metal alloy selected from: aluminium, an aluminium alloy, copper, nickel, tin, silver, or a SnAg alloy.

16. The method according to claim 1, in which the metallic feature is a metallic bond pad or a metallic bump.

17. The method according to claim 1, in which the carrier sheet is made from a polymeric material.

18. The method according to claim 1, in which the substrate is a semiconductor substrate.

* * * * *